(12) United States Patent
Lung et al.

(10) Patent No.: US 7,884,343 B2
(45) Date of Patent: Feb. 8, 2011

(54) PHASE CHANGE MEMORY CELL WITH FILLED SIDEWALL MEMORY ELEMENT AND METHOD FOR FABRICATING THE SAME

(75) Inventors: Hsiang Lan Lung, Elmsford, NY (US); Chieh-Fang Chen, Panshiao (TW)

(73) Assignee: Macronix International Co., Ltd., Hsinchu (TW)

( * ) Notice: Subject to any disclaimer, the term of this patent is extended or adjusted under 35 U.S.C. 154(b) by 360 days.

(21) Appl. No.: 12/016,842

(22) Filed: Jan. 18, 2008

(65) Prior Publication Data

US 2008/0191186 A1    Aug. 14, 2008

Related U.S. Application Data

(60) Provisional application No. 60/889,856, filed on Feb. 14, 2007.

(51) Int. Cl.
*H01L 49/00* (2006.01)
(52) U.S. Cl. .......................... 257/2; 257/4; 257/E31.029; 438/102
(58) Field of Classification Search .......................... 257/2
See application file for complete search history.

(56) References Cited

U.S. PATENT DOCUMENTS

| | | | |
|---|---|---|---|
| 3,271,591 A | 9/1966 | Ovshinsky | |
| 3,530,441 A | 9/1970 | Ovshinsky | |
| 4,599,705 A | 7/1986 | Holmberg et al. | |
| 4,719,594 A | 1/1988 | Young et al. | |
| 4,876,220 A | 10/1989 | Mohsen et al. | |
| 4,959,812 A | 9/1990 | Momodomi et al. | |
| 5,106,775 A | 4/1992 | Kaga et al. | |
| 5,166,096 A | 11/1992 | Cote et al. | |
| 5,166,758 A | 11/1992 | Ovshinsky et al. | |
| 5,177,567 A | 1/1993 | Klersy et al. | |
| 5,332,923 A | 7/1994 | Takeuchi et al. | |
| 5,391,901 A | 2/1995 | Tanabe et al. | |
| 5,534,712 A | 7/1996 | Ovshinsky et al. | |

(Continued)

FOREIGN PATENT DOCUMENTS

CN         1462478         12/2003

(Continued)

OTHER PUBLICATIONS

"Magnetic Bit Boost," www.sciencenews.org, Dec. 18 & 25, 2004, p. 389, vol. 166.

(Continued)

*Primary Examiner*—Jerome Jackson, Jr.
(74) *Attorney, Agent, or Firm*—Haynes Beffel & Wolfeld LLP

(57) ABSTRACT

Memory cells are described along with methods for manufacturing. A memory cell described herein includes a bottom electrode, a top electrode overlying the bottom electrode, a via having a sidewall extending from a bottom electrode to a top electrode, and a memory element electrically coupling the bottom electrode to the top electrode. The memory element has an outer surface contacting a dielectric sidewall spacer that is on the sidewall of the via, and comprises a stem portion on the bottom electrode and a cup portion on the stem portion. A fill material is within an interior defined by an inner surface of the cup portion of the memory element.

15 Claims, 11 Drawing Sheets

U.S. PATENT DOCUMENTS

| | | | |
|---|---|---|---|
| 5,550,396 A | 8/1996 | Tsutsumi et al. | |
| 5,687,112 A | 11/1997 | Ovshinsky | |
| 5,789,277 A | 8/1998 | Zahorik et al. | |
| 5,789,758 A | 8/1998 | Reinberg | |
| 5,814,527 A | 9/1998 | Wolstenholme et al. | |
| 5,831,276 A | 11/1998 | Gonzalez et al. | |
| 5,837,564 A | 11/1998 | Sandhu et al. | |
| 5,869,843 A | 2/1999 | Harshfield | |
| 5,879,955 A | 3/1999 | Gonzalez et al. | |
| 5,902,704 A | 5/1999 | Schoenborn et al. | |
| 5,920,788 A | 7/1999 | Reinberg | |
| 5,933,365 A | 8/1999 | Klersy et al. | |
| 5,952,671 A | 9/1999 | Reinberg et al. | |
| 5,958,358 A | 9/1999 | Tenne et al. | |
| 5,970,336 A | 10/1999 | Wolstenholme et al. | |
| 5,985,698 A | 11/1999 | Gonzalez et al. | |
| 5,998,244 A | 12/1999 | Wolstenholme et al. | |
| 6,011,725 A | 1/2000 | Eitan et al. | |
| 6,025,220 A | 2/2000 | Sandhu | |
| 6,031,287 A | 2/2000 | Harshfield | |
| 6,034,882 A | 3/2000 | Johnson et al. | |
| 6,066,870 A | 5/2000 | Siek | |
| 6,077,729 A | 6/2000 | Harshfield | |
| 6,087,269 A | 7/2000 | Williams | |
| 6,087,674 A | 7/2000 | Ovshinsky et al. | |
| 6,104,038 A | 8/2000 | Gonzalez et al. | |
| 6,111,264 A | 8/2000 | Wolstenholme et al. | |
| 6,114,713 A | 9/2000 | Zahorik | |
| 6,117,720 A | 9/2000 | Harshfield | |
| 6,147,395 A | 11/2000 | Gilgen | |
| 6,150,253 A | 11/2000 | Doan et al. | |
| 6,153,890 A | 11/2000 | Wolstenholme et al. | |
| 6,177,317 B1 | 1/2001 | Huang et al. | |
| 6,185,122 B1 | 2/2001 | Johnson et al. | |
| 6,189,582 B1 | 2/2001 | Reinberg et al. | |
| 6,236,059 B1 | 5/2001 | Wolstenholme et al. | |
| RE37,259 E | 7/2001 | Ovshinsky | |
| 6,271,090 B1 | 8/2001 | Huang et al. | |
| 6,280,684 B1 | 8/2001 | Yamada et al. | |
| 6,287,887 B1 | 9/2001 | Gilgen | |
| 6,314,014 B1 | 11/2001 | Lowrey et al. | |
| 6,316,348 B1 | 11/2001 | Fu et al. | |
| 6,320,786 B1 | 11/2001 | Chang et al. | |
| 6,339,544 B1 | 1/2002 | Chiang et al. | |
| 6,351,406 B1 | 2/2002 | Johnson et al. | |
| 6,372,651 B1 | 4/2002 | Yang et al. | |
| 6,380,068 B2 | 4/2002 | Jeng et al. | |
| 6,420,215 B1 | 7/2002 | Knall et al. | |
| 6,420,216 B1 | 7/2002 | Clevenger et al. | |
| 6,420,725 B1 | 7/2002 | Harshfield | |
| 6,423,621 B2 | 7/2002 | Doan et al. | |
| 6,429,064 B1 | 8/2002 | Wicker | |
| 6,440,837 B1 | 8/2002 | Harshfield | |
| 6,462,353 B1 | 10/2002 | Gilgen | |
| 6,483,736 B2 | 11/2002 | Johnson et al. | |
| 6,487,114 B2 | 11/2002 | Jong et al. | |
| 6,501,111 B1 | 12/2002 | Lowrey | |
| 6,511,867 B2 | 1/2003 | Lowrey et al. | |
| 6,512,241 B1 | 1/2003 | Lai | |
| 6,514,788 B2 | 2/2003 | Quinn | |
| 6,514,820 B2 | 2/2003 | Ahn et al. | |
| 6,534,781 B2 | 3/2003 | Dennison | |
| 6,545,903 B1 | 4/2003 | Wu | |
| 6,551,866 B1 | 4/2003 | Maeda et al. | |
| 6,555,860 B2 | 4/2003 | Lowrey et al. | |
| 6,563,156 B2 | 5/2003 | Harshfield | |
| 6,566,700 B2 | 5/2003 | Xu | |
| 6,567,293 B1 | 5/2003 | Lowrey et al. | |
| 6,579,760 B1 | 6/2003 | Lung et al. | |
| 6,586,761 B2 | 7/2003 | Lowrey | |
| 6,589,714 B2 | 7/2003 | Maimon et al. | |
| 6,593,176 B2 | 7/2003 | Dennison | |
| 6,597,009 B2 | 7/2003 | Wicker | |
| 6,605,527 B2 | 8/2003 | Dennison et al. | |
| 6,605,821 B1 | 8/2003 | Lee et al. | |
| 6,607,974 B2 | 8/2003 | Harshfield | |
| 6,613,604 B2 | 9/2003 | Maimon et al. | |
| 6,617,192 B1 | 9/2003 | Lowrey et al. | |
| 6,620,715 B1 | 9/2003 | Blosse et al. | |
| 6,621,095 B2 | 9/2003 | Chiang et al. | |
| 6,627,530 B2 | 9/2003 | Li et al. | |
| 6,639,849 B2 | 10/2003 | Takahashi et al. | |
| 6,673,700 B2 | 1/2004 | Dennison et al. | |
| 6,674,115 B2 | 1/2004 | Hudgens et al. | |
| 6,744,088 B1 | 6/2004 | Dennison | |
| 6,746,892 B2 | 6/2004 | Lee et al. | |
| 6,750,079 B2 | 6/2004 | Lowrey et al. | |
| 6,791,102 B2 | 9/2004 | Johnson et al. | |
| 6,797,979 B2 * | 9/2004 | Chiang et al. | 257/4 |
| 6,800,504 B2 | 10/2004 | Li et al. | |
| 6,805,563 B2 | 10/2004 | Ohashi et al. | |
| 6,808,991 B1 | 10/2004 | Tung et al. | |
| 6,815,704 B1 | 11/2004 | Chen | |
| 6,830,952 B2 | 12/2004 | Lung et al. | |
| 6,850,432 B2 | 2/2005 | Lu et al. | |
| 6,859,389 B2 | 2/2005 | Idehara et al. | |
| 6,861,267 B2 | 3/2005 | Xu et al. | |
| 6,864,500 B2 | 3/2005 | Gilton | |
| 6,864,503 B2 | 3/2005 | Lung et al. | |
| 6,867,638 B2 | 3/2005 | Saiki et al. | |
| 6,888,750 B2 | 5/2005 | Walker et al. | |
| 6,894,304 B2 | 5/2005 | Moore | |
| 6,894,305 B2 | 5/2005 | Yi et al. | |
| 6,903,362 B2 | 6/2005 | Wyeth et al. | |
| 6,909,107 B2 | 6/2005 | Rodgers et al. | |
| 6,927,410 B2 | 8/2005 | Chen | |
| 6,933,516 B2 | 8/2005 | Xu | |
| 6,936,840 B2 | 8/2005 | Sun et al. | |
| 6,937,507 B2 * | 8/2005 | Chen | 365/163 |
| 6,943,365 B2 | 9/2005 | Lowrey et al. | |
| 6,969,866 B1 | 11/2005 | Lowrey et al. | |
| 6,972,428 B2 | 12/2005 | Maimon | |
| 6,972,430 B2 | 12/2005 | Casagrande et al. | |
| 6,992,932 B2 | 1/2006 | Cohen et al. | |
| 7,023,009 B2 | 4/2006 | Kostylev et al. | |
| 7,033,856 B2 | 4/2006 | Lung et al. | |
| 7,042,001 B2 | 5/2006 | Kim et al. | |
| 7,067,864 B2 | 6/2006 | Nishida et al. | |
| 7,067,865 B2 | 6/2006 | Lung et al. | |
| 7,122,281 B2 | 10/2006 | Pierrat | |
| 7,122,824 B2 | 10/2006 | Khouri et al. | |
| 7,126,149 B2 | 10/2006 | Iwasaki et al. | |
| 7,132,675 B2 | 11/2006 | Gilton | |
| 7,164,147 B2 | 1/2007 | Lee et al. | |
| 7,166,533 B2 | 1/2007 | Happ | |
| 7,214,958 B2 | 5/2007 | Happ | |
| 7,220,983 B2 | 5/2007 | Lung | |
| 7,277,317 B2 | 10/2007 | Le Phan et al. | |
| 7,351,648 B2 | 4/2008 | Furukawa et al. | |
| 2001/0055838 A1 | 12/2001 | Walker et al. | |
| 2002/0070457 A1 | 6/2002 | Sun et al. | |
| 2002/0072223 A1 | 6/2002 | Gilbert et al. | |
| 2002/0081833 A1 | 6/2002 | Li et al. | |
| 2002/0113273 A1 | 8/2002 | Hwang et al. | |
| 2002/0182835 A1 | 12/2002 | Quinn | |
| 2003/0095426 A1 | 5/2003 | Hush et al. | |
| 2004/0026686 A1 | 2/2004 | Lung | |
| 2004/0051094 A1 | 3/2004 | Ooishi | |
| 2004/0051161 A1 | 3/2004 | Tanaka et al. | |
| 2004/0113232 A1 | 6/2004 | Johnson et al. | |
| 2004/0165422 A1 | 8/2004 | Hideki et al. | |
| 2004/0178172 A1 | 9/2004 | Huang et al. | |
| 2004/0208038 A1 | 10/2004 | Idehara | |
| 2005/0018526 A1 | 1/2005 | Lee | |

| | | |
|---|---|---|
| 2005/0019975 A1 | 1/2005 | Lee et al. |
| 2005/0029502 A1 | 2/2005 | Hudgens |
| 2005/0062087 A1 | 3/2005 | Chen et al. |
| 2005/0093022 A1 | 5/2005 | Lung |
| 2005/0106919 A1 | 5/2005 | Layadi et al. |
| 2005/0127347 A1 | 6/2005 | Choi et al. |
| 2005/0130414 A1 | 6/2005 | Choi et al. |
| 2005/0167656 A1 | 8/2005 | Sun et al. |
| 2005/0191804 A1 | 9/2005 | Lai et al. |
| 2005/0201182 A1 | 9/2005 | Osada et al. |
| 2005/0212024 A1 | 9/2005 | Happ |
| 2005/0215009 A1 | 9/2005 | Cho |
| 2005/0285096 A1 | 12/2005 | Kozicki |
| 2006/0038221 A1 | 2/2006 | Lee et al. |
| 2006/0043617 A1 | 3/2006 | Abbott |
| 2006/0073642 A1 | 4/2006 | Yeh et al. |
| 2006/0091476 A1 | 5/2006 | Pinnow et al. |
| 2006/0108667 A1 | 5/2006 | Lung |
| 2006/0110878 A1 | 5/2006 | Lung et al. |
| 2006/0110888 A1 | 5/2006 | Cho et al. |
| 2006/0118913 A1 | 6/2006 | Yi et al. |
| 2006/0154185 A1 | 7/2006 | Ho et al. |
| 2006/0175599 A1 | 8/2006 | Happ |
| 2006/0226409 A1 | 10/2006 | Burr et al. |
| 2006/0234138 A1 | 10/2006 | Fehlhaber et al. |
| 2006/0281216 A1 | 12/2006 | Chang et al. |
| 2006/0284157 A1 | 12/2006 | Chen et al. |
| 2006/0284158 A1 | 12/2006 | Lung et al. |
| 2006/0284214 A1 | 12/2006 | Chen |
| 2006/0284279 A1 | 12/2006 | Lung et al. |
| 2006/0286709 A1 | 12/2006 | Lung et al. |
| 2006/0286743 A1 | 12/2006 | Lung et al. |
| 2007/0010054 A1 | 1/2007 | Fan et al. |
| 2007/0030721 A1 | 2/2007 | Segal et al. |
| 2007/0037101 A1 | 2/2007 | Morioka |
| 2007/0045606 A1 | 3/2007 | Magistretti et al. |
| 2007/0096162 A1 | 5/2007 | Happ et al. |
| 2007/0108077 A1 | 5/2007 | Lung et al. |
| 2007/0108429 A1 | 5/2007 | Lung |
| 2007/0108430 A1 | 5/2007 | Lung |
| 2007/0108431 A1 | 5/2007 | Chen et al. |
| 2007/0109836 A1 | 5/2007 | Lung |
| 2007/0109843 A1 | 5/2007 | Lung et al. |
| 2007/0111429 A1 | 5/2007 | Lung |
| 2007/0115794 A1 | 5/2007 | Lung |
| 2007/0117315 A1 | 5/2007 | Lai et al. |
| 2007/0120104 A1* | 5/2007 | Ahn et al. ............ 257/2 |
| 2007/0121363 A1 | 5/2007 | Lung |
| 2007/0121374 A1 | 5/2007 | Lung et al. |
| 2007/0126040 A1 | 6/2007 | Lung |
| 2007/0131922 A1 | 6/2007 | Lung |
| 2007/0131980 A1 | 6/2007 | Lung |
| 2007/0138458 A1 | 6/2007 | Lung |
| 2007/0147105 A1 | 6/2007 | Lung et al. |
| 2007/0154847 A1 | 7/2007 | Chen et al. |
| 2007/0155172 A1 | 7/2007 | Lai et al. |
| 2007/0158632 A1 | 7/2007 | Ho |
| 2007/0158633 A1 | 7/2007 | Lai et al. |
| 2007/0158645 A1 | 7/2007 | Lung |
| 2007/0158690 A1 | 7/2007 | Ho et al. |
| 2007/0158862 A1 | 7/2007 | Lung |
| 2007/0161186 A1 | 7/2007 | Ho |
| 2007/0173019 A1 | 7/2007 | Ho et al. |
| 2007/0173063 A1 | 7/2007 | Lung |
| 2007/0176261 A1 | 8/2007 | Lung |
| 2007/0187664 A1 | 8/2007 | Happ |
| 2007/0224726 A1 | 9/2007 | Chen et al. |
| 2007/0235811 A1 | 10/2007 | Furukawa et al. |
| 2007/0246699 A1 | 10/2007 | Lung |
| 2007/0257300 A1 | 11/2007 | Ho et al. |
| 2007/0262388 A1 | 11/2007 | Ho et al. |
| 2007/0274121 A1 | 11/2007 | Lung et al. |
| 2007/0285960 A1 | 12/2007 | Lung et al. |
| 2007/0298535 A1 | 12/2007 | Lung |
| 2008/0014676 A1 | 1/2008 | Lung et al. |

FOREIGN PATENT DOCUMENTS

| | | |
|---|---|---|
| WO | WO-0079539 | 12/2000 |
| WO | WO-0145108 | 6/2001 |

OTHER PUBLICATIONS

"New Memories Tap Spin, Gird for Battle," Science News, Apr. 3, 1999, p. 223, vol. 155.

"Optimized Thermal Capacitance in a Phase Change Memory Cell Design," IPCOM000141986D, IP.com Prior Art Database, Oct. 18, 2006, 4pp.

"Remembering on the Cheap," www.sciencenews.org, Mar. 19, 2005, p. 189, vol. 167.

"Thermal Conductivity of Crystalline Dielectrics" in CRC Handbook of Chemistry and Physics, Internet Version 2007, (87th edition), David R. Lide, ed. Taylor and Francis, Boca Raton, FL, 2 pp.

Adler, D. et al., "Threshold Switching in Chalcogenide-Glass Thin Films," J. Appl/ Phys 51(6), Jun. 1980, pp. 3289-3309.

Adler, David, "Amorphous-Semiconductor Devices," Sci. Amer., vol. 236, pp. 36-48, May 1977.

Ahn, S. J. et al., "Highly Reliable 5nm Contact Cell Technology for 256Mb PRAM," VLSI Technology, Digest of Technical Papers, Jun. 14-16, 2005, pp. 98-99.

Ahn, S.J. et al., "A Highly Manufacturable High Density Phase Change Memory of 64 Mb and Beyond," IEEE IEDM 2004, pp. 907-910.

Atwood, G, et al., "90nm Phase Change Technology with μ Trench and Lance Cell Elements," VLSI Technology, Systems and Applications, Apr. 23-25, 2007, pp. 1-2.

Bedeschi, F. et al., "4-MB MOSFET-Selected Phase-Change Memory Experimental Chip," IEEE, 2004, 4 pp.

Blake thesis, "Investigation of GeTeSb5 Chalcogenide Films for Use as an Analog Memory," AFIT/GE/ENG/00M-04, Mar. 2000, 121 pages.

Chao, Der-Sheng, et al., "Low Programming Current Phrase Change Memory Cell with Double GST Thermally Confined Structure," Int'l Symp on VLSI Technology, Systems and Applications, Apr. 23-25, 2007, pp. 1-2.

Chen, An et al., "Non-Volatile Resistive Switching for Advanced Memory Applications," IEEE IEDM, Dec. 5-7, 2005, 4 pp.

Cho, S. L. et al., "Highly Scalable On-axis Confined Cell Structure for High Density PRAM beyond 256Mb," 2005 Symposium on VLSI Technology Digest of Technical Papers, pp. 96-97.

Gibson, G. A. et al, "Phase-change Recording Medium that Enables Ultrahigh-density Electron-beam Data Storage," Applied Physics Letter, 2005, 3 pp., vol. 86.

Gill, Manzur et al., "A High-Performance Nonvolatile Memory Technology for Stand-Alone Memory and Embedded Applications," 2002 IEEE-ISSCC Technical Digest (TD 12.4), 7 pp.

Ha, Y. H. et al., "An Edge Contact Type Cell fro Phase Change RAM Featuring Very Low Power Consumption," 2003 Symposium on VLSI Technology Digest of Technical Papers, pp. 175-176.

Happ, T. D. et al., "Novel None-Mask Self-Heating Pillar Phase Change Memory," 2006 Symposium on VLSI Technology, 2 pp.

Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4 pp.

Horii, H. et al., "A Novel Cell Technology Using N-doped GeSbTe Films for Phase Change RAM," 2003 Symposium on VLSI Technology Digest of Technical Papers, pp. 177-178.

Hudgens, S. et al., "Overview of Phase-Change Chalcogenide Nonvolatile Memory Technology," MRS Bulletin, Nov. 2004, pp. 829-832.

Hwang, Y. N. et al., "Full Integration and Reliability Evaluation of Phase-change RAM Based on 0.24 μm-CMOS Technologies," 2003 Symposium on VLSI Technology Digest of Technical Papers, pp. 173-174.

Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA, 2004, pp. 28-29 and workshop cover sheet.

Kim, Kinam et al., "Reliability Investigations for Manufacturable High Density PRAM," IEEE 43rd Annual International Reliability Physics Symposium, San Jose, 2005, pp. 157-162.

Kojima, Rie et al., "Ge-Sn-Sb-Te Phase-change Recording Material Having High Crystallization Speed," Proceedings of PCOS 2000, pp. 36-41.

Lacita, A. L.; "Electrothermal and Phase-change Dynamics in Chalcogenide-based Memories," IEEE IEDM 2004, 4 pp.

Lai, Stefan, "Current Status of the Phase Change Memory and Its Future," IEEE IEDM 2003, pp. 255-258.

Lai, Stephan et al., OUM-A 180 nm Nonvolatile Memory Cell Element Technology for Stand Alone and Embedded Applications, IEEE IEDM 2001, pp. 803-806.

Lankhorst, Martijn H. R., et al; Low-Cost and Nanoscale Non-Volatile Memory Concept for Future Silicon Chips, Mar. 13, 2005, 6 pp., Nature Materials Advance Online Publication, www.nature.com/naturematerials.

Mott, Nevill, "Electrons in Glass," Nobel Lecture, Dec. 8, 1977, Physics, 1977, pp. 403-413.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al., "Novel µTrench Phase-Change Memory Cell for Embedded and Stand-Alone Non-Volatile Memory Applications," 2004 Symposium on VLSI Technology Digest of Technical Papers, pp. 18-19.

Pirovano, Agostino et al., "Reliability Study of Phase-Change Non-volatile Memories," IEEE Transactions on Device and Materials Reliability, Sep. 2004, pp. 422-427, vol. 4, No. 3.

Prakash, S. et al., "A Guideline for Designing Chalcogenide-Based Glasses for Threshold Switching Characteristics," IEEE Electron Device Letters, vol. 18, No. 2, Feb. 1997, pp. 45-47.

Radaelli, A. et al., "Electronic Switching Effect and Phase-Change Transition in Chalcogenide Materials," IEEE Electron Device Letters, Oct. 2004, pp. 684-686, vol. 25, No. 10.

Rochefort, C. et al., "Manufacturing of High Aspect-Ration p-n Junctions Using Vapor Phase Doping for Application in Multi-Resurf Devices," IEEE 2002, pp. 237-240.

Schafft, Harry A. et al., "Thermal Conductivity Measurements of Thin Films Silicon Dioxide", Proceedings of the IEEE 1989 International Conference on Microelectronic Test Structures vol. 2, No. 1, Mar. 1989, pp. 121-124.

Strauss, Karl F. et al., "Overview of Radiation Tolerant Unlimited Write Cycle Non-Volatile Memory," IEEE 2000, pp. 399-408.

Subramanian, Vivek et al., "Low Leakage Germanium-Seeded Laterally-Crystallized Single-Grain 100-nm TFT's for Vertical Intergration Applications," IEEE Electron Device Letters, vol. 20, No. 7, Jul. 1999, pp. 341-343.

Wicker, Guy et al., Nonvolatile, High Density, High Performance Phase Change Memory, 1999, http://klabs.org/richcontent/MAPLDCon99/Papers/P21_Tyson_P.PDF#search=nonvolatile%20high%20density%20high%20performance%20phase%20change%20memory, 8 pages.

Wicker, Guy, "A Comprehensive Model of Submicron Chalcogenide Switching Devices," Doctoral Dissertation, Wayne State University, Detroit, MI, 1996, 137 pp.

Wolf, Stanley, Excerpt from: Silicon Processing for the VLSI Era—vol. 4, pp. 674-679, 2004.

Wuttig, Matthias, "Towards a Universal Memory?" Nature Materials, Apr. 2005, pp. 265-266, vol. 4.

Yi, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

Yamada, Noboru, "Potential of Ge-Sb-Te phase-change optical disks for high-data-rate recording in the near future," (Conference Proceedings Paper), Jul. 30, 1997, vol. 3109, 10 pages.

* cited by examiner

US 7,884,343 B2

PHASE CHANGE MEMORY CELL WITH FILLED SIDEWALL MEMORY ELEMENT AND METHOD FOR FABRICATING THE SAME

CROSS-REFERENCE TO RELATED APPLICATIONS

This application claims the benefit of U.S. Provisional Application 60/889,856, filed 14 Feb. 2007, entitled Phase Change Memory Cell with Filled Sidewall Memory Element and Method for Fabricating the Same, which is incorporated by reference herein.

This application is related to the following US patent applications, each filed 6 Dec. 2006, assigned to the same assignee and having a common inventor: U.S. application Ser. No. 11/567,300, entitled Method for Making a Self-Converged Memory Material Element for Memory Cell; U.S. application Ser. No. 11/567,314, entitled Method for Making a Keyhole Opening During the Manufacture of a Memory Cell; U.S. application Ser. No. 11/567,326, entitled Method for Making A Self-Converged Void and Bottom Electrode for Memory Cell; each of which are incorporated by reference herein.

PARTIES TO A JOINT RESEARCH AGREEMENT

International Business Machines Corporation, a New York corporation; Macronix International Corporation, Ltd., a Taiwan corporation, and Infineon Technologies A.G., a German corporation, are parties to a Joint Research Agreement.

BACKGROUND OF THE INVENTION

1. Field of the Invention

The present invention relates to high density memory devices based on programmable resistive materials, including phase change materials like chalcogenides, and to methods for manufacturing such devices.

2. Description of Related Art

Phase change based memory materials are widely used in nonvolatile random access memory cells. Such materials, such as chalcogenides and similar materials, can be caused to change phase between an amorphous state and a crystalline state by application of electrical current at levels suitable for implementation in integrated circuits. The generally amorphous state is characterized by higher resistivity than the generally crystalline state, which can be readily sensed to indicate data.

The change from the amorphous to the crystalline state is generally a low current operation. The change from crystalline to amorphous, referred to as reset herein, is generally a higher current operation, which includes a short high current density pulse to melt or breakdown the crystalline structure, after which the phase change material cools quickly, quenching the phase change process, allowing at least a portion of the phase change structure to stabilize in the amorphous state. It is desirable to minimize the magnitude of the reset current used to cause transition of phase change material from a crystalline state to amorphous state. The magnitude of the needed reset current can be reduced by reducing the size of the phase change material element in the cell and by reducing the size of the contact area between electrodes and the phase change material, so that higher current densities are achieved with small absolute current values through the phase change material element.

One problem associated with phase change memory devices arises because the magnitude of the current required for reset operations depends on the volume of phase change material that must change phase. Thus, cells made using standard integrated circuit manufacturing processes have been limited by the minimum feature size of manufacturing equipment. Additionally, variations in the critical dimensions of the memory cells are typically dependent upon the variations in the standard lithographic processes used to form the memory cells. Therefore, techniques to provide sublithographic dimensions for the memory cells must be developed, which can lack uniformity or reliability needed for large scale, high density memory devices.

Accordingly, an opportunity arises to devise methods and structures that form memory cells that have small active regions of programmable resistive material using reliable and repeatable manufacturing methods. Furthermore, it is desirable to produce memory devices having small variations in critical dimensions across an array of memory cells.

SUMMARY OF THE INVENTION

A memory cell described herein includes a bottom electrode, a top electrode overlying the bottom electrode, a via having a sidewall extending from the bottom electrode to the top electrode, and a memory element electrically coupling the bottom electrode to the top electrode. The memory element has an outer surface contacting a dielectric sidewall spacer that is on the sidewall of the via, and comprises a stem portion on the bottom electrode and a cup portion on the stem portion. A fill material is within an interior defined by an inner surface of the cup portion of the memory element.

A method for manufacturing a memory array as described herein includes forming an array of bottom electrodes, forming an isolation layer on the bottom electrodes, and forming a sacrificial layer on the isolation layer. The method includes forming vias in the isolation layer and sacrificial layer to expose respective bottom electrodes in the array of bottom electrodes. The vias have lower segments formed within the isolation layer and upper segments formed within the sacrificial layer, the lower segments having widths greater than those of corresponding upper segments. A dielectric sidewall material is deposited by a process causing formation of voids within the lower segments of the vias. A portion of the dielectric sidewall material is then etched to open the voids and expose upper surfaces of the corresponding bottom electrodes, thereby forming sidewall spacers comprising the dielectric sidewall material. The sidewall spacers define upper and lower openings within the vias, the lower openings extending to the upper surfaces of the bottom electrodes. Memory material is formed on the sidewall spacers and fills the lower openings to contact the corresponding the bottom electrodes, the memory material within the upper openings having inner surfaces defining cups within the vias. The cups are then filled with a fill material, and the memory material and the fill material are planarized to form memory elements comprising the memory material. The memory elements include a stem portion within the lower openings contacting the bottom electrodes, and cup portions within the upper openings and on the stem portions. Top electrodes are then formed on the memory element.

A memory cell as describe herein results in an active region within the stem portion that can be made extremely small, thereby reducing the amount of current needed for reset. The stem portion of the memory element has a width that is preferably smaller than a minimum feature size for a process, typically a lithographic process, used to form the memory cell. The small stem portion concentrates current in the portion of the memory element adjacent the bottom electrode, thereby reducing the magnitude of the current needed to induce a phase change in the active region. Additionally, the fill material and the dielectric sidewall spacer provide thermal isolation to the active region, which also helps to reduce the amount of current necessary to induce a phase change.

Processes described herein result in variations in the stem width among memory cells that are independent of, and can be controlled over a range much less than, the variation in the widths of the vias. This results in variations in the width of the stem portion that is smaller than the variations in the outside diameter of the cup portion. The small variation in the width of the stem portion improves uniformity of operation of an array of memory cells.

Other features, aspects and advantages of the present invention can be seen on review of the figures, the detailed description, and the claims which follow.

DETAILED DESCRIPTION

The following detailed description is made with reference to the figures. Preferred embodiments are described to illustrate the present invention, not to limit its scope, which is defined by the claims. Those of ordinary skill in the art will recognize a variety of equivalent variations on the description that follows.

With regard to directional descriptions herein, the orientation of the drawings establish their respective frames of reference, with "up," "down," "left" and "right" referring to directions shown on the respective drawings. Similarly, "thickness" refers to a vertical dimension and "width" to the horizontal. These directions have no application to orientation of the circuits in operation or otherwise, as will be understood by those in the art.

Figure 1:
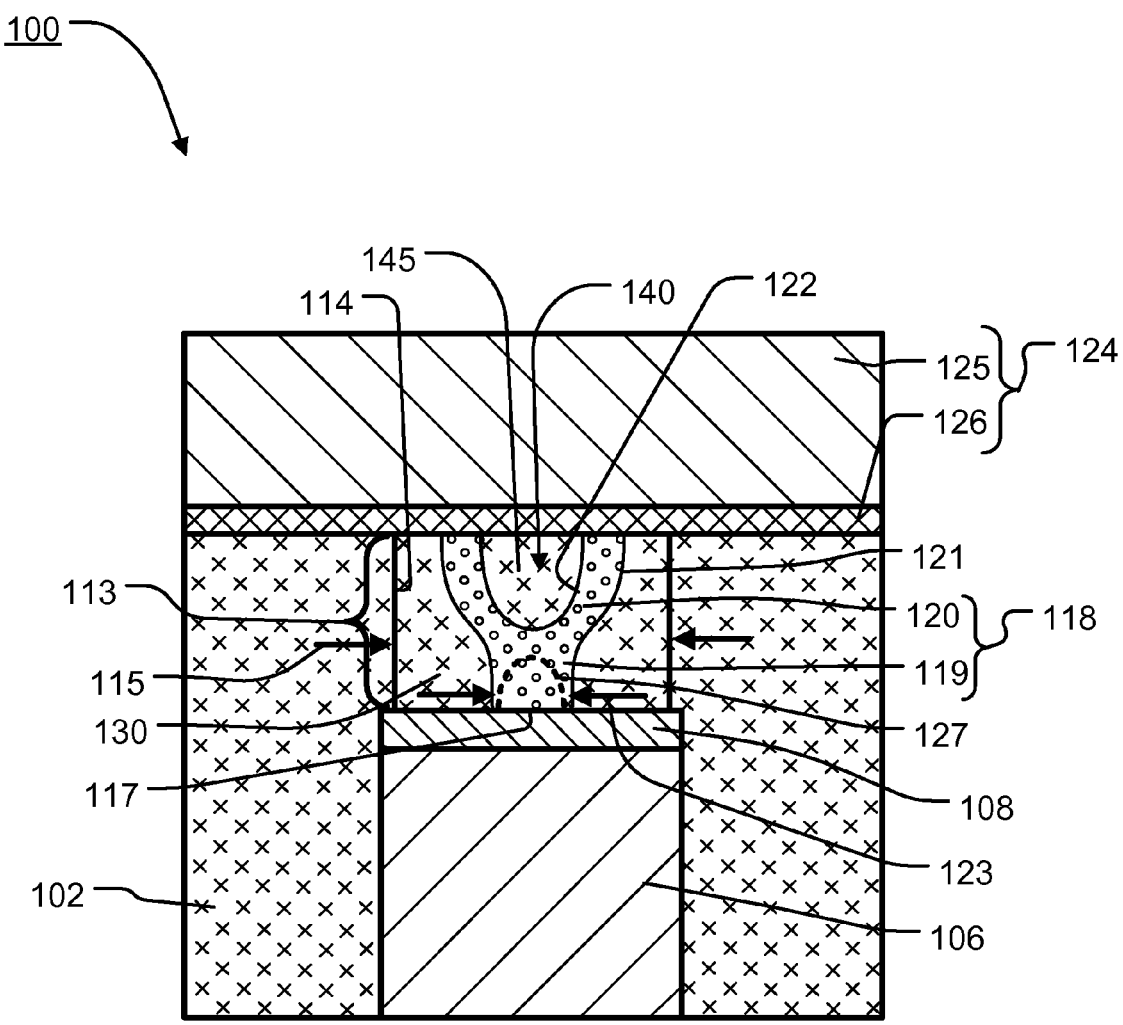
FIG. 1 illustrates a cross-sectional view of a memory cell having a cup-shaped memory element in accordance with an embodiment.

FIG. 1 illustrates a cross-sectional view of a memory cell 100 having a cup-shaped memory element 118. The memory element 118 includes a stem portion 119 and a cup portion 120 on the stem portion 119.

A bottom electrode 108 contacts the bottom surface 117 of the stem portion 119 and couples the memory element 118 to a conductive plug 106. The bottom electrode 108 may comprise, for example, TiN or TaN. TiN may be preferred in embodiments in which the memory element 118 comprises GST (discussed below) because it makes good contact with GST, it is a common material used in semiconductor manufacturing, and it provides a good diffusion barrier at the higher temperatures at which GST transitions, typically in the 600-700° C. range. Alternatively, the bottom electrode 108 may be TiAlN or TaAlN, or comprises, for further examples, one or more elements selected from the group consisting of Ti, W, Mo, Al, Ta, Cu, Pt, Ir, La, Ni, N, O and Ru and combinations thereof. In some embodiments the layer 108 may be omitted and the plug 106 may act as the bottom electrode.

The conductive plug 106 extends through a dielectric 102 to underlying access circuitry (not shown), the plug 106 comprising a refractory metal such as tungsten in the illustrated embodiment. Other metals that could be used include Ti, Mo, Al, Ta, Cu, Pt, Ir, La, Ni, and Ru. Other plug structures and materials can be used as well.

A via 113 in the dielectric layer 102 and has a sidewall 114 extending from the bottom electrode 108 to a top electrode 124. A dielectric sidewall spacer 130 is on the sidewall 114 of the via 113 and contacts an outside surface 121 of the memory element 118. The dielectric sidewall spacer 130 comprises material that preferably has a thermal conductivity less than the material of the memory element 118.

The memory element 118 has an inner surface 122 defining an interior 140 containing a fill material 145. The fill material 145 is an electrically insulating material and preferably has a lower thermal conductivity than the material from which memory element 118 is made. Fill material 145 may comprise, for example, one or more elements selected from the group consisting of Si, Ti, Al, Ta, N, O, and C. Examples of materials which are candidates for use for fill material 145 include fluorinated $SiO_2$, SiCOH, polymide, polyamide, and fluorocarbon polymers. In one embodiment fill material 145 comprises a spin-on glass SOG.

In another embodiment, the fill material comprises a conductive material, such as one of the materials described above for use as the bottom electrode 108, and may be the same material as used for layer 126 described below, or another conductive material that can serve to improve electrical contact between the memory element 118 and the top electrode 124.

The top electrode 124 (which in some embodiments is a portion of a bit line) comprises a first conductive layer 126 contacting the memory element 118 and a second conductive layer 125 on the first conductive layer 126. The first conductive layer 126 can comprise materials as described above with reference to the bottom electrode 108. Advantages of having both layers 125 and 126 include choosing the material of the first conductive layer 126 for compatibility with the material of the memory element 118 (such as acting as a diffusion barrier layer), while material of the second conductive layer 125 can be chosen for other advantages such as a lower electrical resistivity than the material of the first conductive layer 126. In some embodiments the top electrode 124 comprises a single layer.

The dielectric 102 may comprise one or more layers of dielectric material, each of the layers comprising, for example, any of the materials discussed above with reference to the fill material 145.

In operation, voltages on the plug 106 and the top electrode 124 can induce current to flow from the plug 106 to the top electrode 124, or vice-versa, via the bottom electrode 108 and memory element 118. During operation, the current is concentrated in the stem portion 119 of the memory element 118 because the stem portion 119 has a lower cross sectional area of memory material than the cup portion 120.

The active region 127 is the region of the memory element 118 in which the memory material is induced to change between at least two solid phases. As can be appreciated the active region 127 can be made extremely small in the illustrated structure, thus reducing the magnitude of current needed to induce a phase change. The stem portion 119 of the memory element 118 has a width 123 (which in the illustrated embodiment is a diameter) contacting the bottom electrode 108. The width 123 is preferably smaller than a minimum feature size for a process, typically a lithographic process, used to form the memory cell 100. The small stem portion 119 concentrates current in the portion of the memory element 118 adjacent the bottom electrode 108, thereby reducing the magnitude of the current needed to induce a phase change in the active region 127. Additionally, the fill material 145 and the dielectric sidewall spacer 130 provide thermal isolation to the active region 127, which also helps to reduce the amount of current needed to induce a phase change.

For an array of memory cells 100, the via 113 has a width that varies over a range dependent on the process, for example lithographic and etching processes, used to form the via 113. The width 123 of the stem portion 119 is formed using a process that compensates for the variation in the width of the via 113, and therefore varies over a range that is substantially less than the width 115 of the via 113. The process that compensates for the variation in the via causes self-convergence of the width 123 to a smaller range, thus improving the uniformity of operation of the array of memory cells.

Embodiments of memory cell 100 include phase change based memory materials, including chalcogenide based materials and other materials, for memory element 118. Chalcogens include any of the four elements oxygen (O), sulfur (S), selenium (Se), and tellurium (Te), forming part of group VIA of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from group IVA of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_a Ge_b Sb_{100-(a+b)}$, where a and b represent atomic percentages that total 100% of the atoms of the constituent elements. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. (Ovshinsky '112 patent, cols 10-11.) Particular alloys evaluated by another researcher include $Ge_2Sb_2Te_5$, $GeSb_2Te_4$ and $GeSb_4Te_7$. (Noboru Yamada, "Potential of Ge—Sb—Te Phase-Change Optical Disks for High-Data-Rate Recording", SPIE v. 3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Chalcogenides and other phase change materials are doped with impurities in some embodiments to modify conductivity, transition temperature, melting temperature, and other properties of memory elements using the doped chalcogenides. Representative impurities used for doping chalcogenides include nitrogen, silicon, oxygen, silicon dioxide, silicon nitride, copper, silver, gold, aluminum, aluminum oxide, tantalum, tantalum oxide, tantalum nitride, titanium and titanium oxide. See, e.g. U.S. Pat. No. 6,800,504, and U.S. Patent Application Publication No. US 2005/0029502.

Phase change materials can be changed from one phase state to another by application of electrical pulses. It has been observed that a shorter, higher amplitude pulse tends to change the phase change material to a generally amorphous state, and is referred to as a reset pulse. A longer, lower amplitude pulse tends to change the phase change material to a generally crystalline state, and is referred to as a program pulse. The energy in a shorter, higher amplitude pulse is high enough to allow for bonds of the crystalline structure to be broken and short enough to prevent the atoms from realigning into a crystalline state. Appropriate profiles for pulses can be determined empirically, without undue experimentation, specifically adapted to a particular phase change material and device structure.

Representative chalcogenide material can be characterized as follows: $Ge_x Sb_y Te_z$, where x:y:z=2:2:5. Other compositions can be used with x: 0~5; y: 0~5; z: 0~10. GeSbTe with doping, such as N—, Si—, Ti—, or other element doping, may also be used. These materials can be formed by PVD sputtering or magnetron-sputtering with reactive gases of Ar, N2, and/or He, etc. and chalcogenide at the pressure of 1 mtorr~100 mtorr. The deposition is usually done at room temperature. A collimator with an aspect ratio of 1~5 can be used to improve the fill-in performance. To improve the fill-in performance, the DC bias of several tens of volts to several hundreds of volts is also used. Also, the combination of DC bias and the collimator can be used simultaneously. The post deposition annealing treatment with vacuum or N2 ambient is sometimes needed to improve the crystallized state of chalcogenide material. The annealing temperature typically ranges 100° C. to 400° C. with an anneal time of less than 30 minutes.

FIGS. 2-13 illustrate steps in a fabrication sequence in accordance with an embodiment for manufacturing memory cells described herein.

Figure 2:
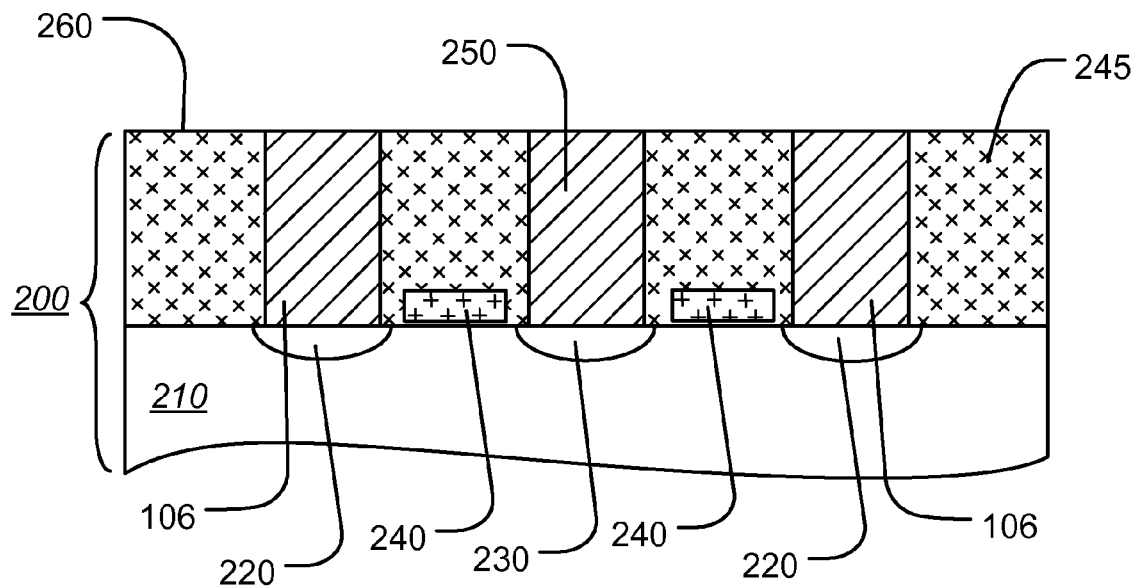
FIGS. 2-14 illustrate steps in a fabrication sequence in accordance with an embodiment for manufacturing memory cells.

FIG. 2 illustrates a cross-sectional view of a first step of providing a memory access layer 200 having a top surface 260. The memory access layer 200 can be formed by standard process as known in the art and includes word lines 240 extending in a direction into and out of the cross section illustrated in FIG. 2. The word lines 240 overly a substrate 210 and form the gates of access transistors. Access layer 200 also includes a common source line 250 contacting doped region 230 acting as the source regions of the access transistors. In other embodiments the common source line 250 may be implemented by a doped region in the substrate 210. The plugs 106 extend though dielectric 245 to contact corresponding doped regions 220 in the substrate 210 acting as drain regions for the access transistors.

Figure 3:
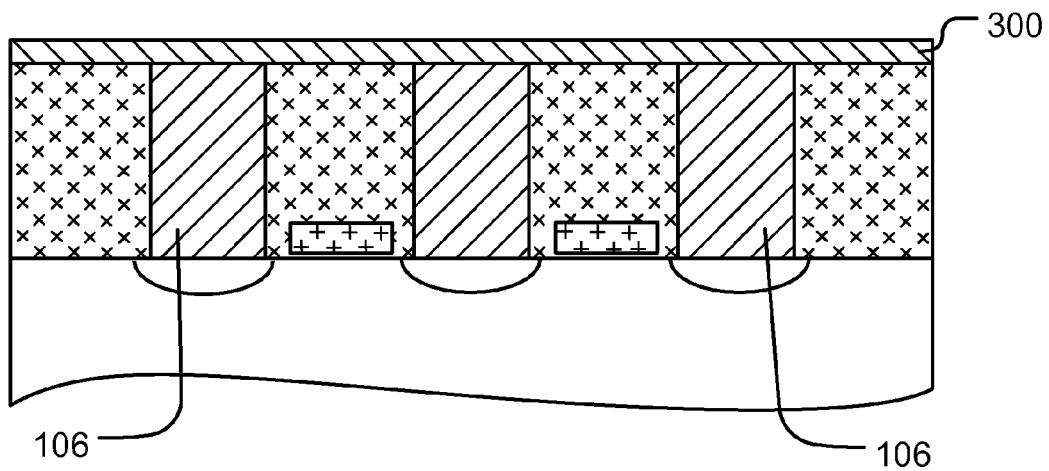

Next, a conductive layer 300 comprising bottom electrode material is formed on the structure illustrated in FIG. 2, resulting in the structure illustrated in FIG. 3. The conductive layer 300 is then patterned to form bottom electrodes 108 on corresponding plugs 106 as illustrated in FIG. 4.

Figure 4:
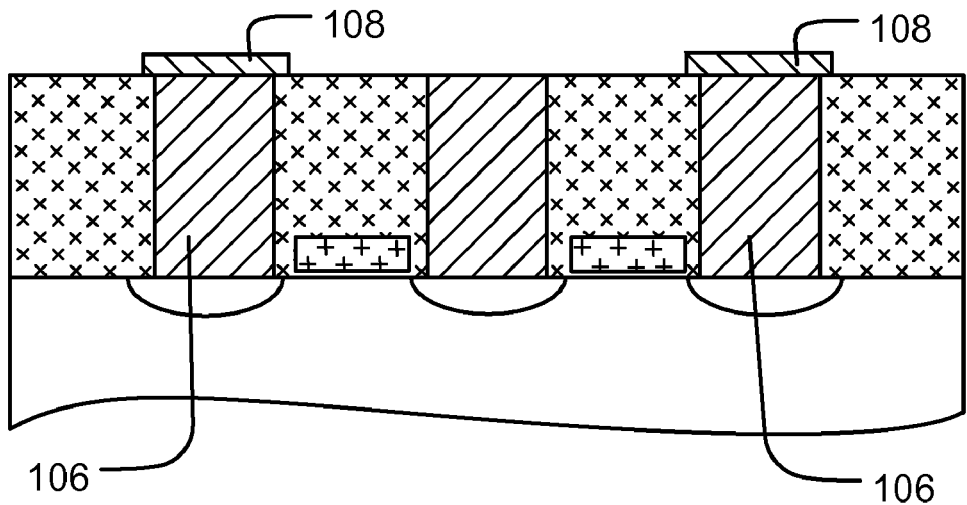
Figure 5:
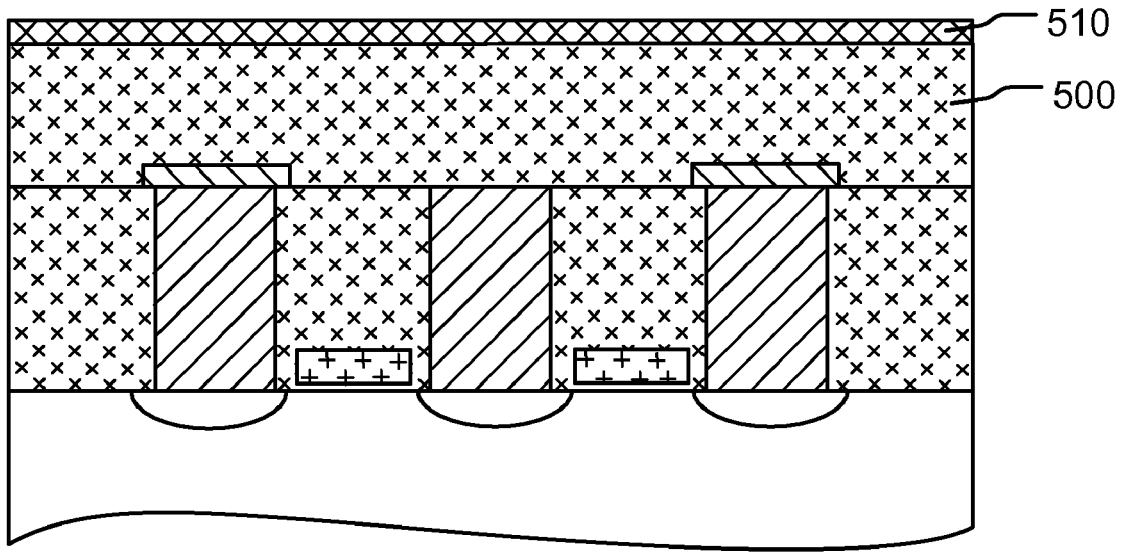

An isolation layer 500 is then formed on the structure illustrated in FIG. 4, and a sacrificial layer 510 is formed on the isolation layer 500, resulting in the structure illustrated in FIG. 5. The materials for the layers 500, 510 are chosen for the ability to be selectively etched as described below. In the illustrated embodiment the isolation layer 500 comprises silicon dioxide and the sacrificial layer 510 comprises silicon nitride.

Figure 6:
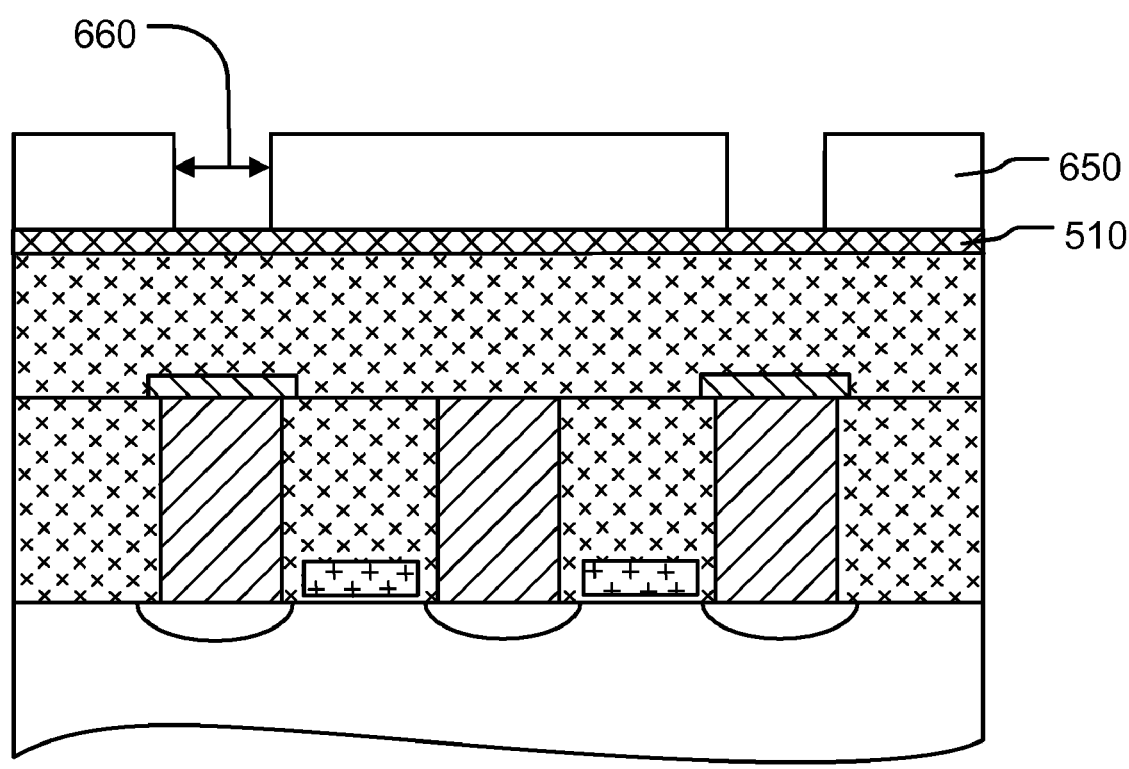

Next, a mask 650 having openings 660 close to or equal to the minimum feature size of the process used to create the mask is formed on the sacrificial layer 510, resulting in the structure illustrated in FIG. 6 with the openings 660 overlying the bottom electrodes 108.

The isolation layer 500 and the sacrificial layer 510 are then etched using the mask 650 to form vias 600 exposing top surfaces of the bottom electrodes 108. The vias 600 may be formed using an anisotropic, non-selective etch technique, such as a directional plasma etch technique, suitable for etching both sacrificial layer 510 and isolation layer 500. Several suitable directional non-selective etch techniques are known in the art. Alternatively, two etch techniques are used, such as using a first etch technique to define the vias through the sacrificial layer 510, and then using a second etch technique to define the vias through the isolation layer 500.

Figure 7:
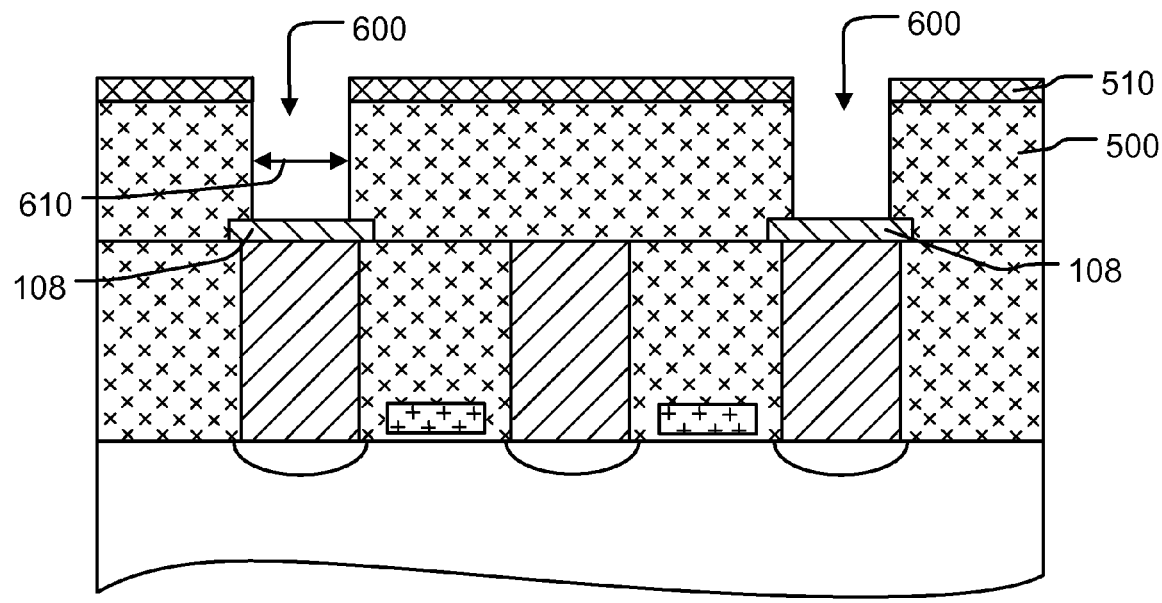

The mask is then removed, resulting in the structure illustrated in FIG. 7. It is preferred that the width 610 of the vias 600 is close to the minimum feature size of the process used, typically a minimum lithographic feature size, to create the opening. Using conventional lithographic techniques, the width 610 can be about 90 nm and will typically vary about 5% to 10%.

Figure 8:
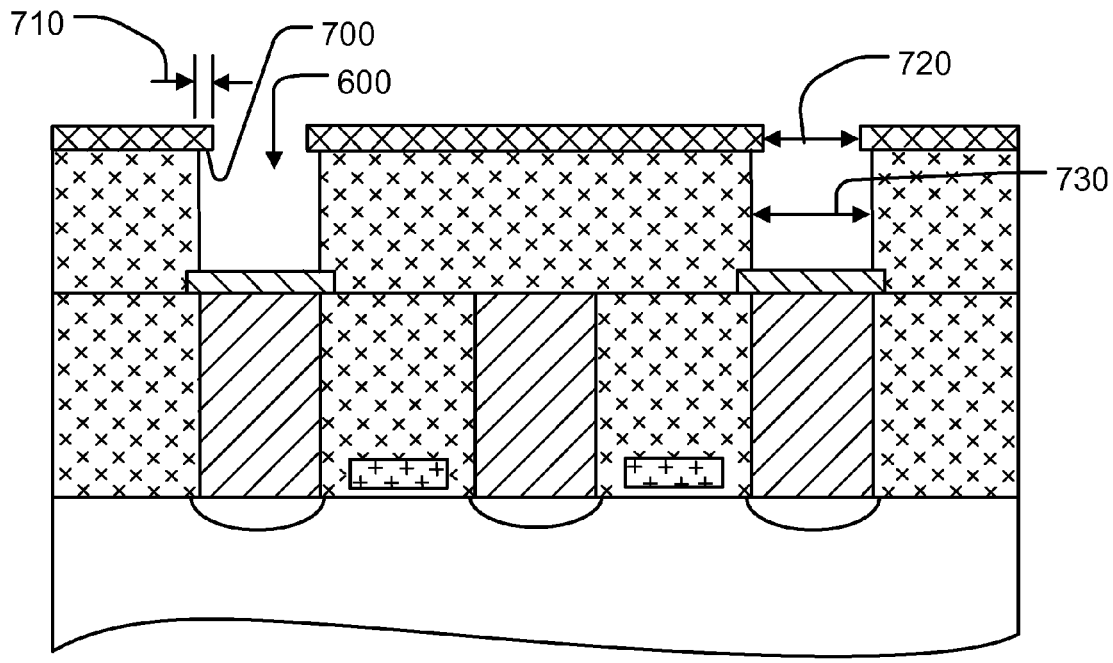

FIG. 8 illustrates a next stage in the process, in which the vias 600 are subjected to a selective undercutting etching process to remove part of the isolation layer 500 while leaving the sacrificial layer 510 and the bottom electrodes 108 intact. In embodiments in which the isolation layer 500 comprises silicon dioxide, the selective etching may comprise applying dilute HF solution to slowly remove the silicon dioxide. The selective etching process forms overhang portions 700 of the sacrificial layer 510 having an overhang dimension 710 which can be very well controlled, and is not significantly affected by variations in the width 610 of the vias 600. Thus, the overhang dimension 710 can be very uniform across an array. After the selective etching, the vias have an upper segment with width 720 and a lower segment with width 730.

In an alternative process to that of FIG. 8, the sacrificial layer 510 comprises a material which can be selectively expanded to create the overhang. For example, using polysilicon for the sacrificial layer 510, oxidation of the structure of FIG. 7 can be used to form the overhang portion while not effectively increasing the volume of the isolation layer 500.

Figure 9:
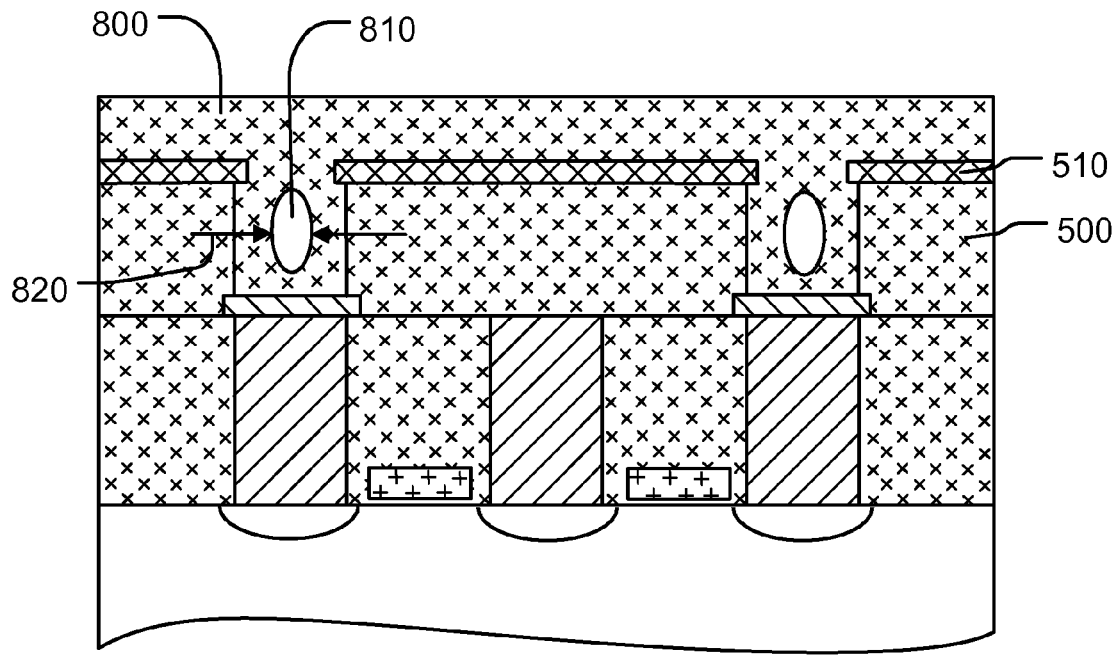

Next, a conformal layer 800 is formed on the structure illustrated in FIG. 8, resulting in the structure illustrated in FIG. 9 having self aligned voids 810 within the vias 600. The layer 800 is formed by a process that grows the material at a substantially equal rate on the walls of the upper and lower segments of the vias 600, resulting in the formation of a void 810 when the top of the vias 600 closes before the interior is filled. In the illustrated embodiment layer 800 comprises silicon dioxide and is formed using chemical vapor deposition CVD. Other materials chosen for their etch chemistry and the ability to grow conformal layers within high aspect ratio vias could also be used for the layer 800. Also, other procedures, such as atomic layer deposition, physical layer deposition, low-pressure chemical vapor deposition (LCPVD) of high density plasma chemical vapor deposition (HDPCVD) could be used to deposit the layer 800, depending on the materials and geometries involved.

The layer 800 deposition creates the self-aligned void 810 centered within the lower segment of the via 600. The void 810 has a width 820 with a variation among voids in an array which is significantly less than the variation in the width of vias 600. This is because the deposition of layer 800 into two different vias having different widths will result in more material of layer 800 being formed on the sidewall of the via having the larger width. The width 820 of the void 810 is thus primarily controlled by the overhang dimension 710 and by variations in the deposition rates with the lower and upper segments of the via 600, and is independent of the lithographic process used to form the vias 600.

Figure 10:
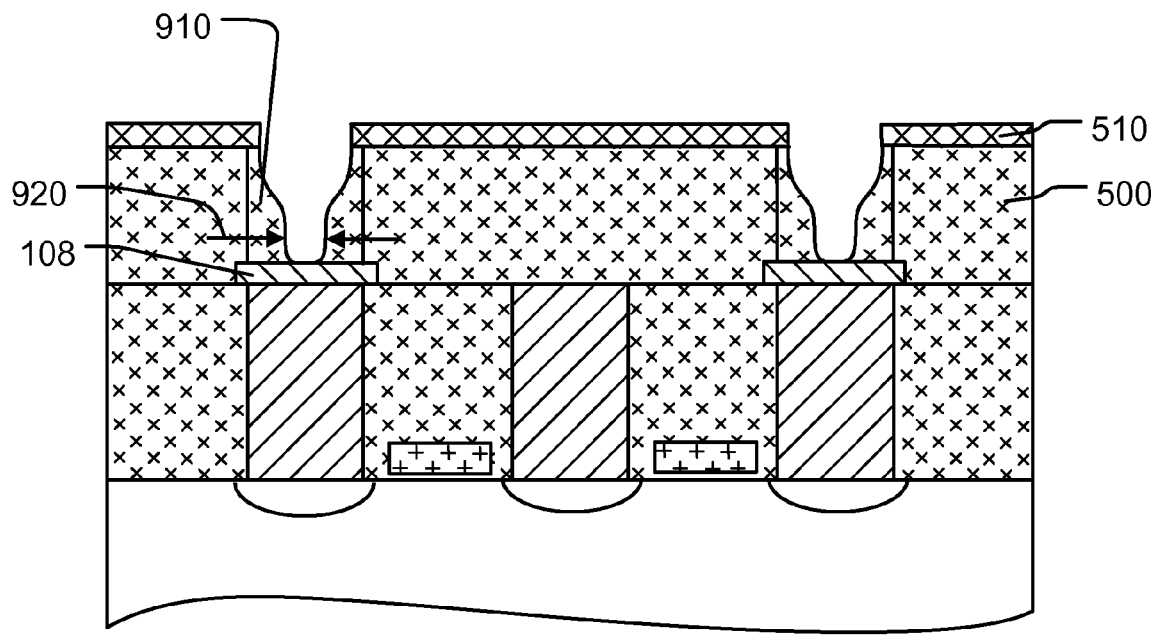

Next, the layer 800 is etched using an anisotropic etching process to form sidewall spacers 910 within the vias 600 and expose upper surfaces of the bottom electrodes 108, resulting in the structure illustrated in FIG. 10. The sidewall spacers 910 have an opening dimension 920 that is substantially determined by the width 820 of the void 810. Specifically, the anisotropic etching used to form the sidewall spacers results in lower openings within the vias having widths determined by the width of the voids, and upper openings within the vias having widths determined by the width of the vias. Since the voids in an array of memory cells have variations in width determined by the overhang while the vias have variations in width determined typically by a lithographic process, the lower openings within the vias vary among cells in an array by significantly less than the upper openings. Thus, the subsequently formed memory element (See FIG. 13A ref. no. 118) will have a stem portion within the lower opening having a variation in width among cells in an array which is significantly less than the variation in the outside diameter of a cup portion formed within the upper portion. Specifically, for at least two cells in an array, the respective diameters of the stem portions differ by less than the respective outside diameters of the cup portions.

Alternatively to the process step illustrated in FIG. 10, the sidewall spacers 910 may be formed using chemical mechanical polishing CMP to remove the material 800 down to the layer 510, and then a directional etch technique may be used to form the sidewall spacers 910.

Figure 11:
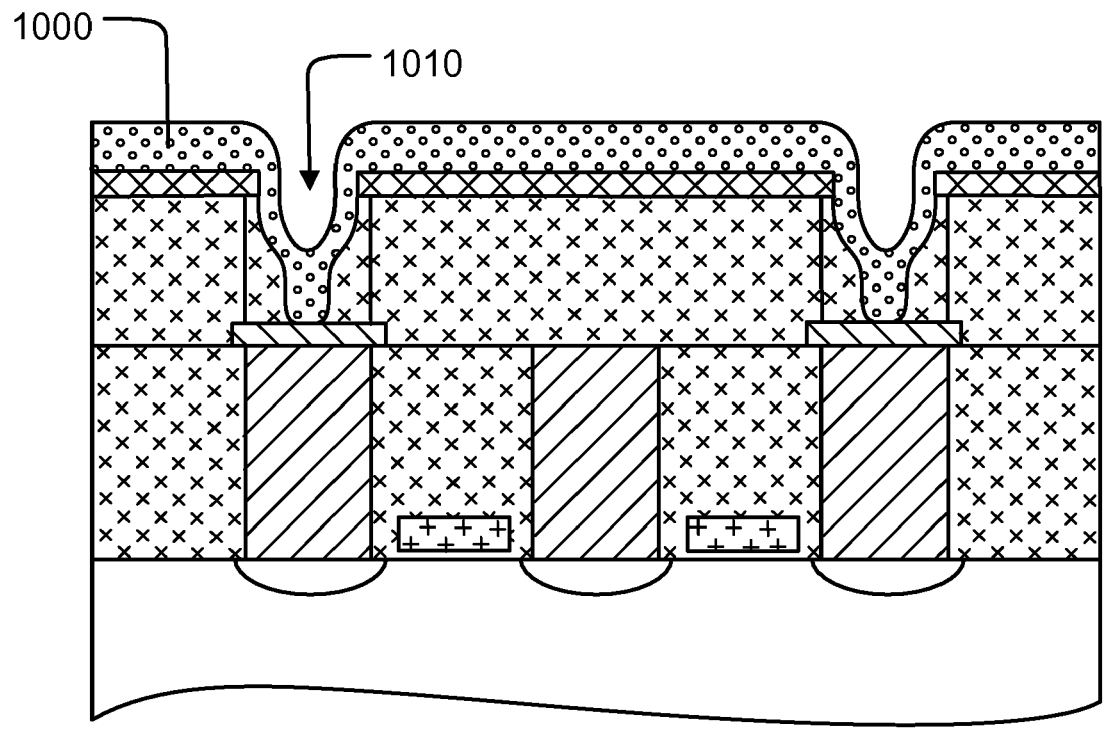

Next, a layer of memory material 1000 is formed on the structure illustrated in FIG. 10, resulting in the structure illustrated in FIG. 11. Alternatively, the sacrificial layer 510 is removed before the layer of memory material 1000 is formed. The layer of memory material 1000 defines cup openings 1010 within the vias 600.

Figure 12:
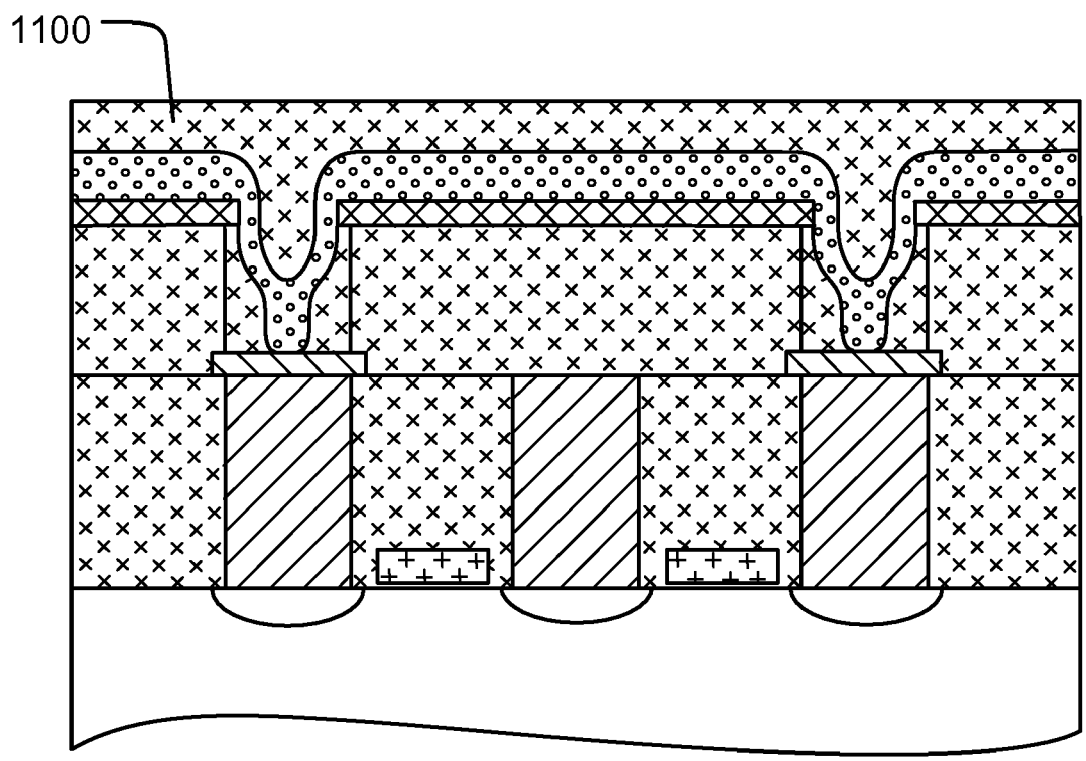

Next, a dielectric layer of fill material 1100 is formed on the structure illustrated in FIG. 11 to fill the cup openings 1010, resulting in the structure illustrated in FIG. 12. In a particular embodiment, the fill material 1100 is a spin-on glass ("SOG"), which provides excellent fill characteristics and also low thermal conductivity, which is desirable for thermally isolating the subsequently formed memory material elements. Other dielectric fill materials are alternatively used, such as spin-on low-k materials including ones that form porous dielectric materials, or vapor-deposited dielectric materials. Alternatively, as mentioned above, the fill material 1100 may be a conductive material.

Figure 13A:
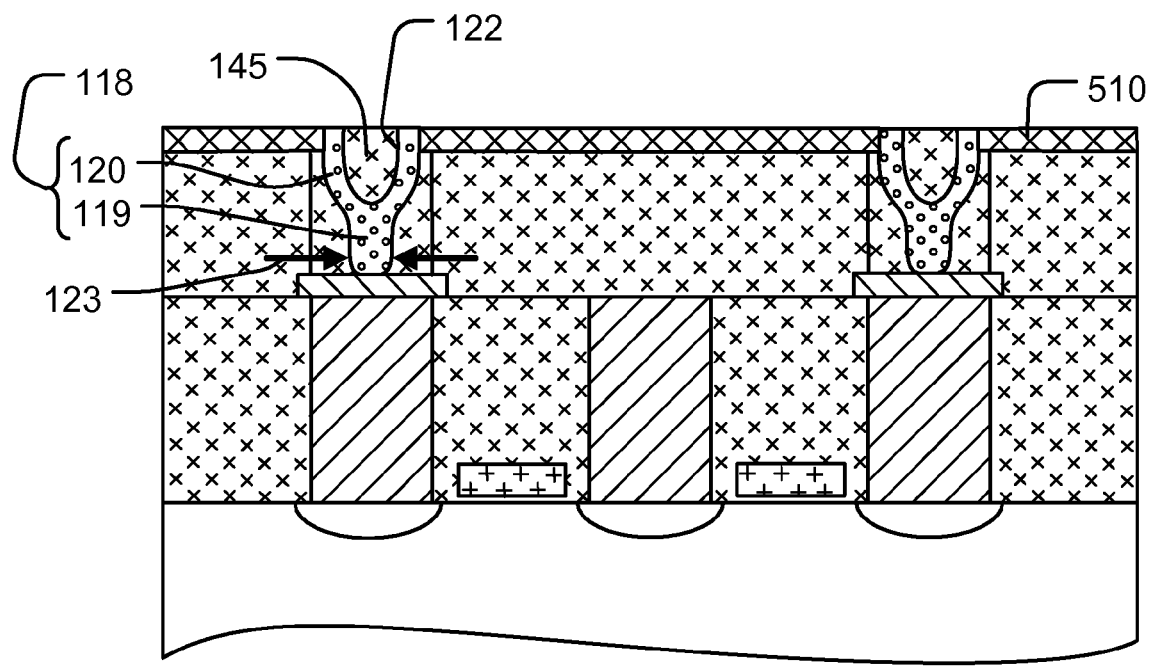
Figure 13B:
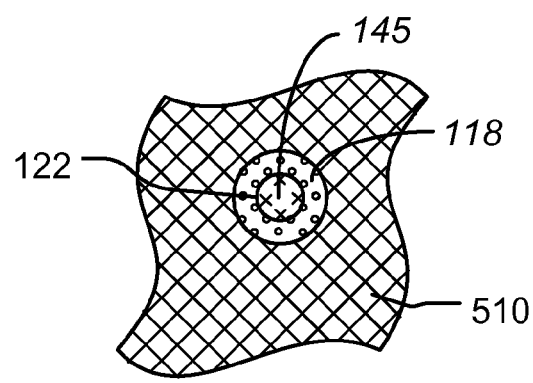

Next, a planarizing process such as CMP is performed on the structure illustrated in FIG. 12, resulting in the structure illustrated in cross-sectional and top views of FIGS. 13A and 13B respectively. As can be seen in the Figures, memory elements 118 have an inner surface 122 defining an interior containing fill 145. The memory elements 118 also have a stem portion 119 and a cup portion 120 on the stem portion 119. Since the voids 810 of FIG. 9 are substantially centered in the vias 600, the subsequently formed memory element 118 will be self-aligned to and substantially centered over the bottom electrode 108.

The stem portion 119 of the memory element 118 has a width 123 equal to the sidewall opening 920 of FIG. 10. Accordingly, the width 123 can be sublithographic in size and will be very uniform across an array of memory cells. Additionally, the width 123 is not significantly affected by variations in the width 610 of the vias 600 of FIG. 7.

Figure 14:
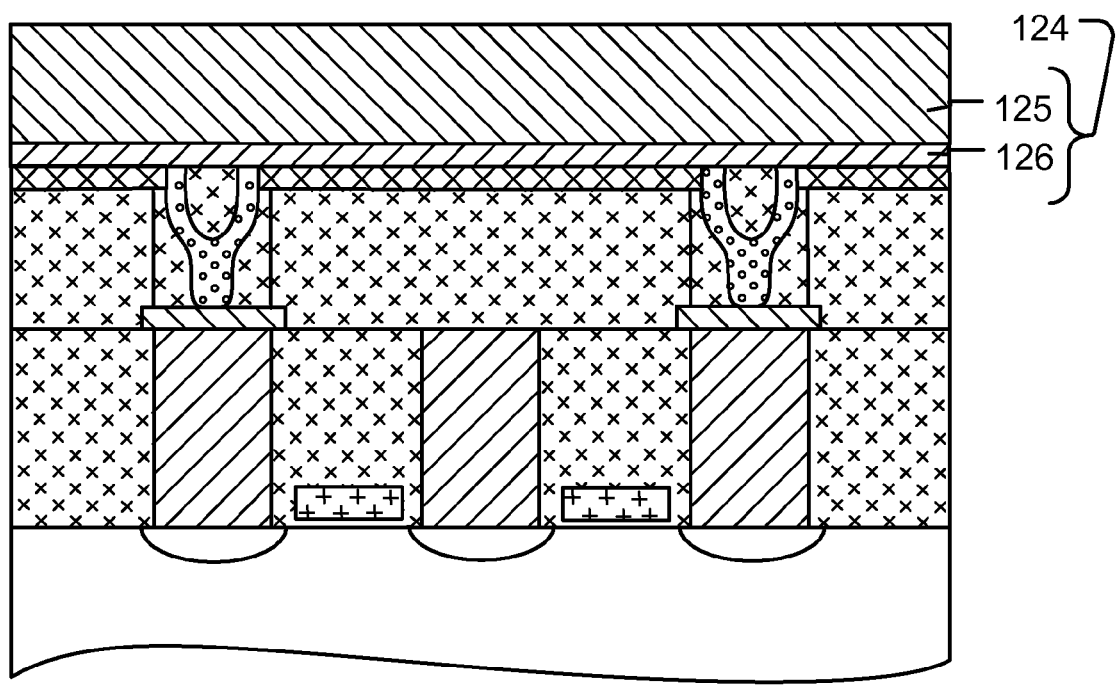

Next, a top electrode 124 is formed on the structure illustrated in FIG. 13, resulting in the structure illustrated in FIG. 14. In the illustrated embodiment, the top electrode 124 comprises a portion of a bit line and is formed by forming first conductive layer 126 on the structure illustrated in FIG. 13, forming second conductive layer 125 on the first conductive layer 126, and patterning the first and second conductive layers 126, 125. In some alternative embodiments, the top electrode 124 is a single conductive layer.

Arrays of memory cells manufactured by the process illustrated in FIGS. 2-14 can be very uniform since the width of the stem portion of the memory element can have a variation from memory cell to memory cell that is dependent upon the variation in the overhang dimension (See FIG. 8, reference number 710) and is essentially independent of the variations in the overall width of the vias (see FIG. 7, reference numbers 610 and 600). Since the undercut etch can be controlled sufficiently that the variation in the overhang dimension is much less than the variation in the width of the via, the process is self-centering within the via, and self-converging for the critical dimension of the diameter of the stem portion. Therefore, memory cells described herein will exhibit much more uniform performance across an array. Furthermore, since the stem portion concentrates current in the memory element and the width of the stem portion can be less than the minimum lithographic feature size used to form the memory cell, the active region can be made extremely small and the current needed to induce a phase change can be reduced.

Figure 15:
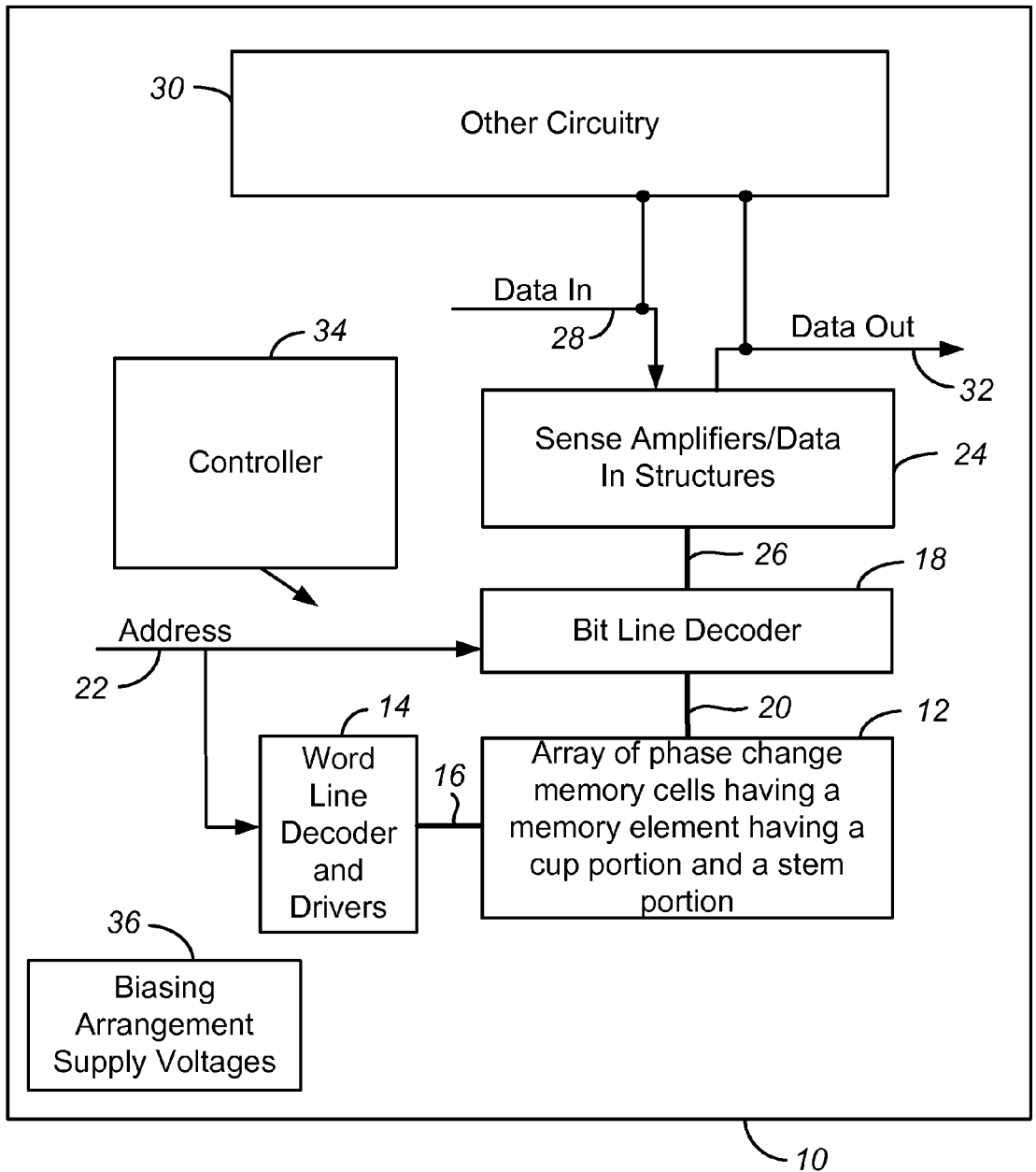
FIG. 15 is a simplified block diagram of an integrated circuit including a memory array implemented using memory cells described herein.

FIG. 15 is a simplified block diagram of an integrated circuit 10 including a memory array 12 implemented using phase change memory cells as described herein having a stem portion and a cup portion on the stem portion. A word line decoder 14 is coupled to, and in electrical communication with, a plurality of word lines 16. A bit line (column) decoder 18 is in electrical communication with a plurality of bit lines 20 to read data from, and write data to, the phase change memory cells in array 12. Addresses are supplied on bus 22 to word line decoder and drivers 14 and bit line decoder 18. Sense amplifiers and data-in structures in block 24 are coupled to bit line decoder 18 via data bus 26. Data is supplied via a data-in line 28 from input/output ports on integrated circuit 10, or from other data sources internal or external to integrated circuit 10, to data-in structures in block 24. Other circuitry 30 may be included on integrated circuit 10, such as a general purpose processor or special purpose application circuitry, or a combination of modules providing system-on-a-chip functionality supported by array 12. Data is supplied via a data-out line 32 from the sense amplifiers in block 24 to input/output ports on integrated circuit 10, or to other data destinations internal or external to integrated circuit 10.

A controller 34, implemented in this example using a bias arrangement state machine, controls the application of bias arrangement supply voltages 36, such as read, program, erase, erase verify and program verify voltages. Controller 34 may be implemented using special-purpose logic circuitry as known in the art. In alternative embodiments, controller 34 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 34.

Figure 16:
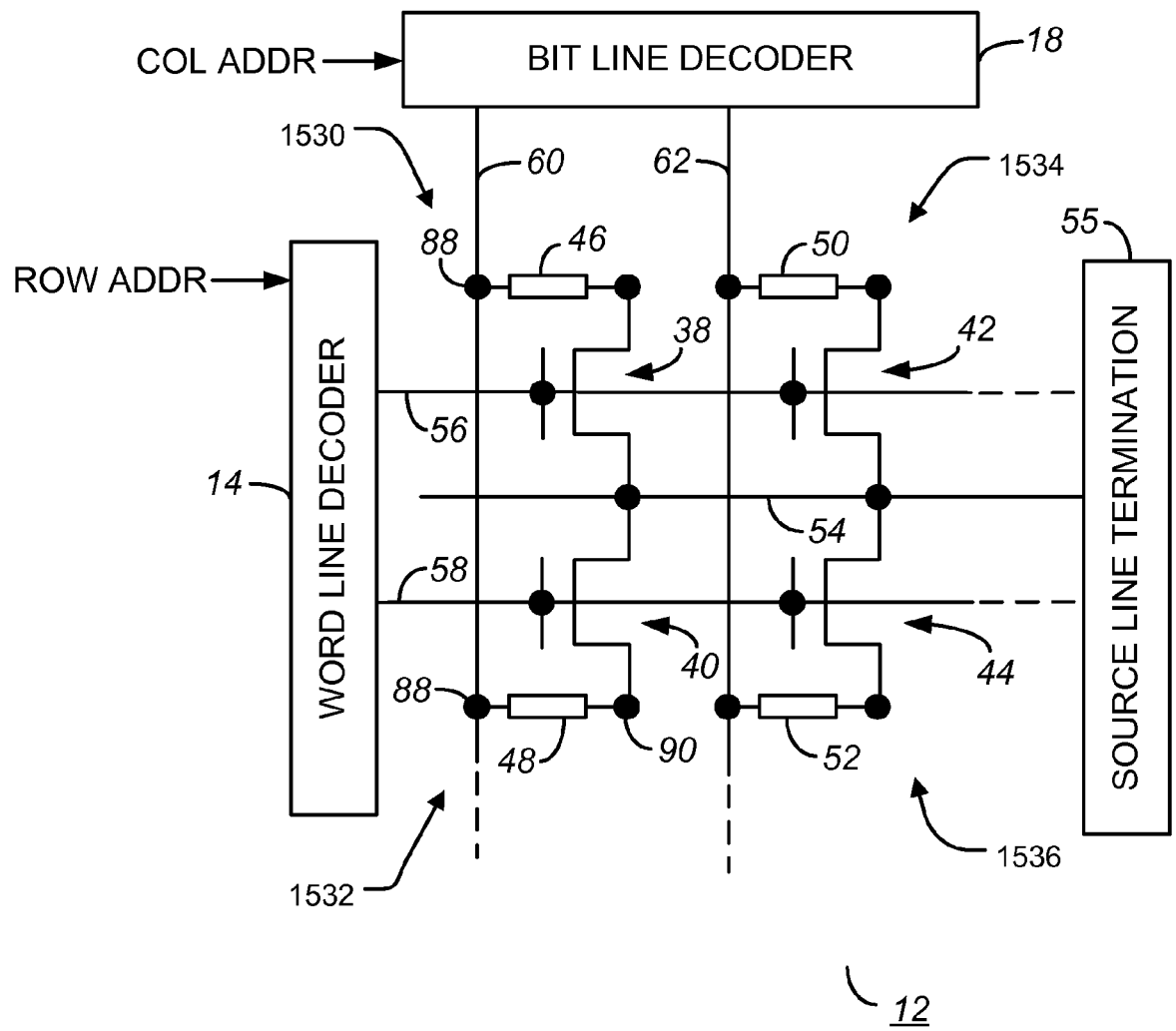
FIG. 16 is a schematic diagram of a portion of a memory array in accordance with an embodiment.

As shown in FIG. 16 each of the memory cells 1530, 1532, 1534, 1536 of array 12 includes an access transistor (or other access device such as a diode), four of which are shown as 38, 40, 42 and 44, and a phase change element, shown as 46, 48, 50 and 52. Sources of each of access transistors 38, 40, 42 and 44 are connected in common to a source line 54 that terminates in a source line termination 55. In another embodiment the source lines of the access devices are not electrically connected, but independently controllable. A plurality of word lines including word lines 56 and 58 extend in parallel along a first direction. Word lines 56 and 58 are in electrical communication with word line decoder 14. The gates of access transistors 38 and 42 are connected to a common word line, such as word line 56, and the gates of access transistors 40 and 44 are connected in common to word line 58. A plurality of bit lines including bit lines 60 and 62 extend in parallel along a second direction and are connected to one end of the phase change elements, for example phase change elements 46 and 48 are connected to bit line 60. Specifically, phase change element 46 is connected between the drain of access transistor 38 and bit line 60, and phase change element 48 is connected between the drain of access transistor 40 and bit line 60. Similarly, phase change element 50 is connected between the drain of access transistor 42 and bit line 62, and phase change element 52 is connected between the drain of access transistor 44 and bit line 62. It should be noted that four memory cells are shown for convenience of discussion and in practice array 12 may comprise thousands to millions of such memory cells. Also, other array structures may be used, e.g. the phase change memory element is connected to the source of an access transistor.

While the present invention is disclosed by reference to preferred embodiments and examples detailed above, it is to be understood that these examples are intended in illustrative rather than limiting sense. It is contemplated that modifications and combinations will occur to those skilled in the art, which modifications and combinations will be within the spirit of the disclosure and the scope of the following claims. Any and all patents, patent applications and printed publications referred to above are incorporated by reference.

What is claimed is:

1. A memory cell comprising:
    a bottom electrode;
    a top electrode overlying the bottom electrode;
    a via having a sidewall extending from the bottom electrode to the top electrode;
    a dielectric spacer on the sidewall of the via;
    a memory element electrically coupling the bottom electrode to the top electrode and having an outer surface, the outer surface contacting the dielectric spacer, the memory element comprising a stem portion on the bottom electrode and a cup portion on the stem portion, the cup portion having an inner surface, wherein the memory element comprises a memory material having at least two solid phases; and
    a dielectric fill material within an interior defined by the inner surface of the cup portion of the memory element, the dielectric fill material is fully circumferentially surrounded by the memory element.

2. The memory cell of claim 1, wherein the top electrode comprises a portion of a bit line.

3. The memory cell of claim 1, wherein the stem portion has a width less than a minimum feature size for a lithographic process used to form the memory cell.

4. The memory cell of claim 1, wherein the memory material comprises a phase change material.

5. The memory cell of claim 1, wherein the dielectric spacer comprises a material having a lower thermal conductivity than that of the memory material.

6. The memory cell of claim 1, wherein the dielectric material has a lower thermal conductivity than that of the memory material.

7. A memory device comprising an array of memory cells, respective memory cells in the array including a memory element comprising a stem portion and a cup portion on the stem portion, the cup portion having an inner surface, a dielectric fill material within an interior defined by the inner surface of the cup portion of the memory element, the dielectric fill material fully circumferentially surrounded by the memory element, wherein the stem portions of the memory elements in the memory cells of the array have respective diameters, and the cup portions of the memory elements in the memory cells of the array have respective outside diameters, and for at least two cells in the array the respective diameters of the stem portions differ by less than the respective outside diameters of the cup portions.

8. A method for manufacturing a memory array, comprising:
    forming an array of bottom electrodes;
    forming an isolation layer on the array of bottom electrodes and a sacrificial layer on the isolation layer;
    forming vias in the isolation layer and the sacrificial layer to expose respective bottom electrodes in the array of bottom electrodes, the vias having lower segments formed within the isolation layer and upper segments formed within the sacrificial layer, the lower segments having widths greater than those of corresponding upper segments;
    depositing a dielectric sidewall material in the vias by a process causing formation of voids within the lower segments of the vias;
    etching portions of the dielectric sidewall material to open the voids and expose upper surfaces of the corresponding bottom electrodes, thereby forming sidewall spacers comprising the dielectric sidewall material defining upper openings and lower openings within the vias, the lower openings extending to the upper surfaces of the bottom electrodes;
    forming memory material on the sidewall spacers and filling the lower openings to contact the corresponding bottom electrodes, the memory material within the upper openings having inner surfaces defining cups within the vias;
    filling the cups with a fill material;
    planarizing the memory material and the fill material, thereby forming memory elements comprising the memory material having stem portions within the lower openings contacting the bottom electrodes and cup portions within the upper openings and on the stem portions; and
    forming top electrodes on the memory elements.

9. The method of claim 8, wherein the voids have widths determined by the differences in the widths of the upper and lower segments of the vias.

10. The method of claim 8, wherein the lower openings within the vias have widths determined by the widths of the voids, and the upper openings within the vias have widths determined by the widths of the vias.

11. The method of claim 8, wherein said forming vias comprises:
    forming a mask having openings overlying the bottom electrodes;
    etching through the isolation layer and sacrificial layer using the mask, thereby exposing the upper surfaces of the bottom electrodes; and
    selectively etching the isolation layer.

12. The method of claim 8, wherein said forming a top electrode comprises forming a first electrically conductive layer on the memory element and forming a second electrically conductive layer on the first electrically conductive layer, wherein the second conductive layer comprises a portion of a bit line.

13. The method of claim 8, wherein the top electrode comprises a portion of a bit line.

14. The method of claim 8, wherein the fill material and the dielectric sidewall material each have a thermal conductivity less than that of the memory material.

15. The method of claim 8, wherein the sacrificial layer comprises a silicon nitride and the isolation layer comprises silicon dioxide.

* * * * *